US007800439B2

(12) United States Patent
Riedel et al.

(10) Patent No.: US 7,800,439 B2
(45) Date of Patent: Sep. 21, 2010

(54) HIGH SPEED PREAMPLIFIER CIRCUIT, DETECTION ELECTRONICS, AND RADIATION DETECTION SYSTEMS THEREFROM

(75) Inventors: Richard A. Riedel, Knoxville, TN (US); Alan L. Wintenberg, Knoxville, TN (US); Lloyd G. Clonts, Knoxville, TN (US); Ronald G. Cooper, Oakridge, TN (US)

(73) Assignee: Ut-Battelle, LLC, Oak Ridge, TN (US)

( * ) Notice: Subject to any disclaimer, the term of this patent is extended or adjusted under 35 U.S.C. 154(b) by 120 days.

(21) Appl. No.: 11/588,996

(22) Filed: Oct. 27, 2006

(65) Prior Publication Data

US 2009/0224835 A1   Sep. 10, 2009

Related U.S. Application Data

(60) Provisional application No. 60/854,923, filed on Oct. 27, 2006.

(51) Int. Cl.
*H03F 17/00* (2006.01)
(52) U.S. Cl. .................. 330/59; 250/214 A; 330/110; 330/292; 330/302; 330/306; 330/308
(58) Field of Classification Search ............... 330/59, 330/110, 292, 302, 307, 306, 308; 250/214 A
See application file for complete search history.

(56) References Cited

U.S. PATENT DOCUMENTS 6,342,694 B1 *   1/2002   Satoh .................. 250/214 A 2005/0062544 A1   3/2005   Kishida
2006/0054790 A1   3/2006   Schmidt

FOREIGN PATENT DOCUMENTS

JP           11-041036      * 12/1999

OTHER PUBLICATIONS

Wikipedia definition of Op Amp actual date unknown.*

(Continued)

*Primary Examiner*—Michael B Shingleton
(74) *Attorney, Agent, or Firm*—Novak Druce + Quigg LLP; Gregory A. Nelson; Eduardo J. Quinones

(57) ABSTRACT

A preamplifier circuit for processing a signal provided by a radiation detector includes a transimpedance amplifier coupled to receive a current signal from a detector and generate a voltage signal at its output. A second amplification stage has an input coupled to an output of the transimpedance amplifier for providing an amplified voltage signal. Detector electronics include a preamplifier circuit having a first and second transimpedance amplifier coupled to receive a current signal from a first and second location on a detector, respectively, and generate a first and second voltage signal at respective outputs. A second amplification stage has an input coupled to an output of the transimpedance amplifiers for amplifying the first and said second voltage signals to provide first and second amplified voltage signals. A differential output stage is coupled to the second amplification stage for receiving the first and second amplified voltage signals and providing a pair of outputs from each of the first and second amplified voltage signals. Read out circuitry has an input coupled to receive both of the pair of outputs, the read out circuitry having structure for processing each of the pair of outputs, and providing a single digital output having a timestamp therefrom.

7 Claims, 19 Drawing Sheets

OTHER PUBLICATIONS

Bonen et al., Novel approach for increased dynamic range in optoelectronic sensing applications, Electronics Letters, vol. 30, No. 18, pp. 1513-1515, Sep. 1, 1994.

Jayakumar et al., 3.3 V MSM-TIA for Gigabit Ethernet, GAAS IC Symposium, 21st Annual, Monterey, CA, USA, pp. 91-94, Oct. 17-20, 1999.

* cited by examiner

DUAL DIGITAL POT FOR
SUM GAIN ADJUST

HIGH SPEED PREAMPLIFIER CIRCUIT, DETECTION ELECTRONICS, AND RADIATION DETECTION SYSTEMS THEREFROM

CROSS-REFERENCE TO RELATED APPLICATIONS

This application claims priority to U.S. Provisional Application No. 60/854,923, filed Oct. 27, 2006, entitled "HIGH SPEED PREAMPLIFIER CIRCUIT, DETECTION ELECTRONICS, AND RADIATION DETECTION SYSTEMS THEREFROM."

STATEMENT REGARDING FEDERALLY SPONSORED RESEARCH OR DEVELOPMENT

The United States Government has rights in this invention pursuant to contract no. DEAC05-00OR22725 between the United States Department of Energy and UT-Battelle, LLC.

FIELD OF THE INVENTION

The present invention relates to high speed preamplifier circuits, and related detector electronics and radiation detection systems.

BACKGROUND OF THE INVENTION

The wide angular range chopper spectrometer (ARCS) is a neutron scattering instrument being developed for the Spallation Neutron Source (SNS). ARCS provides a high neutron flux at the sample, and a large solid angle of detector.

Neutrons at the SNS are produced by the spallation process where high energy protons impact a target producing a large flux of neutrons at many energies in a short period of time. The SNS instruments use time-of-flight (TOF) measurements to determine the energies of the neutrons. To determine the TOF of a detected neutron the detector electronics requires a timing marker that indicates the point in time when protons hit the spallation target.

ARCS is a Fermi chopper spectrometer with a moderate resolution in energy ($\omega$) and a large momentum (Q) transfer range using neutrons with an incident energy of ($E_i$) from 20 to 2,000 meV. ARCS can be used to advance the science of dynamical processes in materials. It is designed to measure excitations in materials and condensed matter having energies from a few meV to several hundred meV, with an efficiency better than any existing high-energy chopper spectrometer. Applications include, but are not limited to: (i) studies of vibrational excitations and their relationship to phase diagrams and equations of state of materials, including materials with correlated electrons, and (ii) studies of spin correlations in magnets, superconductors, and materials close to metal-insulator transitions.

FIG. 1 shows the schematic diagram of an exemplary ARCS spectrometer 100. The neutrons produced by proton bombardment of the target (not shown) are moderated by a decoupled ambient water moderator 101. Neutrons then propagate through the incident beam line to the sample 110 which is housed in sample chamber 106. Along the incident beam line is a core vessel insert that allows placement of neutron optics close to the moderator 101 and neutron guide from the shutter out.

The beamline of ARCS 100 comprises neutron guide 105 comprising moderator 101, $T_o$ chopper 102, and Fermi chopper 103. The $T_o$ chopper 102 is placed about 8.5 m from the moderator 101 to block neutrons when the protons hit the target. The Fermi chopper 103 operates at speeds up to 600 Hz which defines $E_i$. Detectors 115 detects neutron scattered by sample 110. Detectors 115 are shown disposed in vacuum vessel 120.

The sample 110 and everything beyond it constitute the secondary spectrometer. Neutrons scatter off the sample 110 in the evacuated sample chamber (vessel) 120 and travel to linear position-sensitive detectors (LPSDs) 115 filled with $He^3$ at a pressure of 10 atmospheres (1.0 MPa). The neutron time of flight is measured by these detectors to determine the final energy ($E_f$) of the scattered neutron.

ARCS is designed to operate with neutrons of 20 meV<$E_i$<2000 meV. The moderator optimized to provide neutrons in this energy range is the poisoned decoupled water moderator. The poisoning depth is optimized to provide the most flux with a time distribution narrow enough to make a negligible contribution to the instrument's energy resolution. Furthermore, this depth is optimized under the constraint of minimizing the performance degradation to other instruments viewing the same face of this moderator.

Regarding detector 115, the ARCS has been designed to utilize linear position-sensitive detectors. The detector array on ARCS is designed to comprises ~900 1.0 m long by 25 mm diameter LPSDS. the LPSDS are filled with $He^3$ at a pressure of 10 atmospheres (1.0 mpa). The lengths of the detectors 115 will be divided into pixels of ~15 mm length by the electronics, for a total of ~60,000 individual detector elements. Each pixel will subtend an angle of ~0.5°. Each pixel should have a timing resolution of 1 µs and should saturate at no less than 70,000 n/s. After saturation a tube shall be ready for measurement within 10 µs. The detectors will be grouped into modules of eight within the vacuum vessel. They will feed data to the data acquisition software for manipulation and histogramming, as required.

The detector electronics (not shown in FIG. 1) associated with the detectors 115 are key part of the ARCS. The front end of the detector electronics comprise preamplifier circuitry. Current state of the art pre-amplifier designs utilizes a first operational amplifier having a large feedback resistor (typically >1 Mohms) which is operable to integrate the input charge detected by the detector, the first amplifier being coupled to a pulse shaping filter of the Gaussian type.

ARCS could be simplified by putting the detectors and associate electronics into a vacuum vessel as shown in FIG. 1. However, placing the detector electronics in the vacuum is not compatible with conventional preamplification circuitry due mainly to large amounts of power dissipation. Additionally, other on board support circuitry useful in such environments for example temperature sensors are not in generally used. Moreover, particularly for applications such as ARCS, higher speed electronics that operate well beyond the 100 kHz currently available, as well as improved high voltage protection circuitry and noise rejection, are requirements.

SUMMARY

A preamplifier circuit for processing a signal provided by a radiation detector includes a transimpedance amplifier coupled to receive a current signal from a detector and generate a voltage signal at its output. A second amplification stage has an input coupled to an output of the transimpedance amplifier for providing an amplified voltage signal. The second amplification stage can comprises a second op amp, further comprising a structure for compensating voltage or current offsets, wherein an inverting input of the second op amp is coupled to the output of the transimpedance amplifier and the structure for compensating is coupled to a non-inverting input of the second op amp. The structure for compensating can comprise an external voltage source driving a voltage divider having one end grounded, wherein a center tap of the voltage divider is directly coupled to the said non-inverting input of the second op amp. The preamplifier can further comprise a differential output stage coupled to the second amplification stage, wherein the differential output stage receives the amplified voltage signal and provides first and second outputs. In one embodiment, the detector comprises a linear position detector.

Detector electronics comprise a preamplifier circuit comprising a first and second transimpedance amplifier coupled to receive a current signal from a first and second location on a detector, respectively, and generate a first and second voltage signal at respective outputs. A second amplification stage has an input coupled to an output of the transimpedance amplifiers for amplifying the first and said second voltage signals to provide first and second amplified voltage signals. A differential output stage is coupled to the second amplification stage, wherein the differential output stage receives the first and second amplified voltage signals and provides a pair of outputs from each of the first and second amplified voltage signals. Read out circuitry is provided having an input coupled to receive both of the pair of outputs, the read out circuitry having structure for processing each of the pair of outputs, and providing a single digital output having a timestamp therefrom.

The structure for processing can comprises a serial connection of a differential amplifier for converting the pairs of outputs to single outputs (A and B), a summation stage for summing the single outputs into a summed output, integration circuitry, and an A/D converter. The summation stage can include programmable gain balancing circuitry for balancing signal levels of the single outputs. The detector electronics can further comprise discrimination circuitry coupled to the summation stage and the integration circuitry, wherein the discrimination circuitry has one channel for receiving the summed output for signal detection and one channel for receiving the negative (inversion) of the summed output for noise detection, wherein detection of a logical 1 on the signal detection channel initiates timing of the integration circuitry. The channels can comprise comparators.

BRIEF DESCRIPTION OF THE DRAWINGS

A fuller understanding of the present invention and the features and benefits thereof will be obtained upon review of the following detailed description together with the accompanying drawings, in which.

DETAILED DESCRIPTION

The invention describes a preamplifier circuit for processing a signal provided by a radiation detector, detector electronics including preamplifiers according to the invention, and related radiation detection systems. The preamplifier circuit comprises a transimpedance amplifier coupled to receive a current signal from a detector which outputs a low current, such as a linear position detector, and generate a voltage signal at its output. A second amplification stage has an input coupled to an output of the transimpedance amplifier for amplifying the voltage signal. Significantly, unlike conventional state of the art preamplifier circuitry, the first stage transimpedance amplifier does not integrate detected charge and the second amplification stage does not provide pulse shaping.

The second amplification stage generally comprises a second op amp and preferably includes structure for compensating voltage or current offsets coupled to a non-inverting input of the second op amp. For example, the structure for compensating can comprise an external voltage source driving a voltage divider having one end grounded, wherein a center tap of the voltage divider is directly coupled to the non-inverting input of the second op amp. The compensating circuitry could also be comprised of a programmable digital to analog converter (DAC) which would allow dynamic compensation of offsets. Such a circuit would be particularly useful in applications with wide ambient temperature variations.

One or more additional stages can follow the second pre amplifier stage. In one embodiment, a third and final differential output stage drives the amplified signals on twisted pair wires. Signals on twisted pair wires are well known to provide good common mode noise rejection.

In one embodiment, the detector is a Linear Position Gas Detector and the radiation comprises neutrons, and a plurality of detectors with detector electronics according to the invention are integrated in an ARCS system. However, in general, the present invention can be easily adapted to any detector system that outputs a small charge or small current, such as a current in the picoamp or femtoamp range, or is a low impedance voltage source. Although generally described relative to an ARCS system, the present invention can support other radiation detection systems, and radiation other than neutrons. For example, the present invention can be modified to be used with photo-tubes in scintillator based applications. By modifying the scintillator, different types of radiation such as x-rays could be detected.

Figure 1:
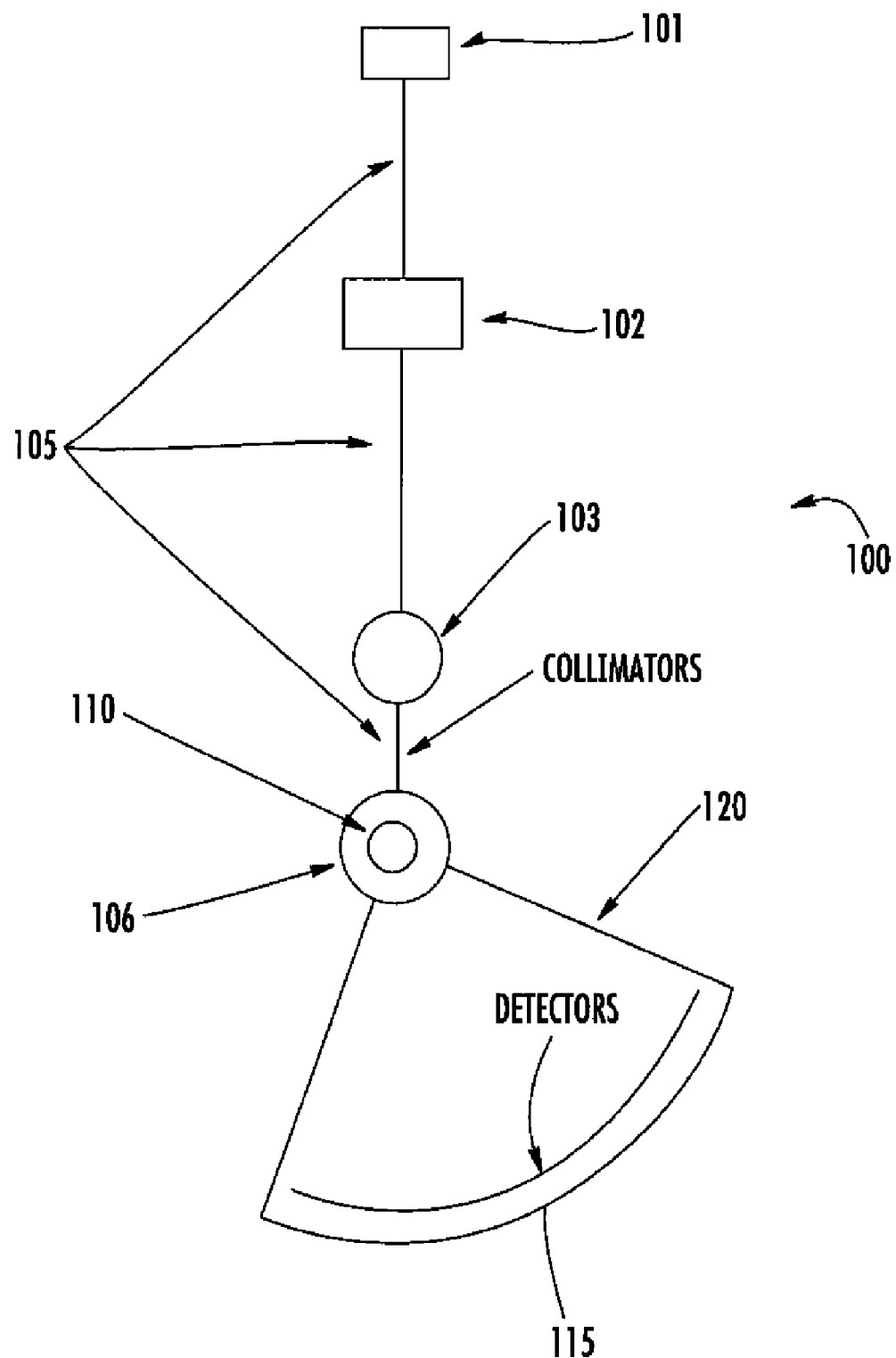
FIG. 1 shows a schematic diagram of an exemplary ARCS spectrometer. The detectors are shown in the vacuum vessel, although being desirable, is not a conventional arrangement.

In a preferred embodiment, the detectors are mounted in vacuum within the ARCS vessel, such as shown in FIG. 1. This eliminates the need for thin aluminum windows that must withstand many cycles of differential pressure between zero and one atmosphere. This arrangement presents a safety issue because of the tremendous mechanical energy stored in the evacuated chamber. Separation of the vessel structural integrity from the detector and window mounting also means that detector coverage can be almost continuous in angle. This is a prime consideration for single-crystal spectroscopy.

Figure 2:
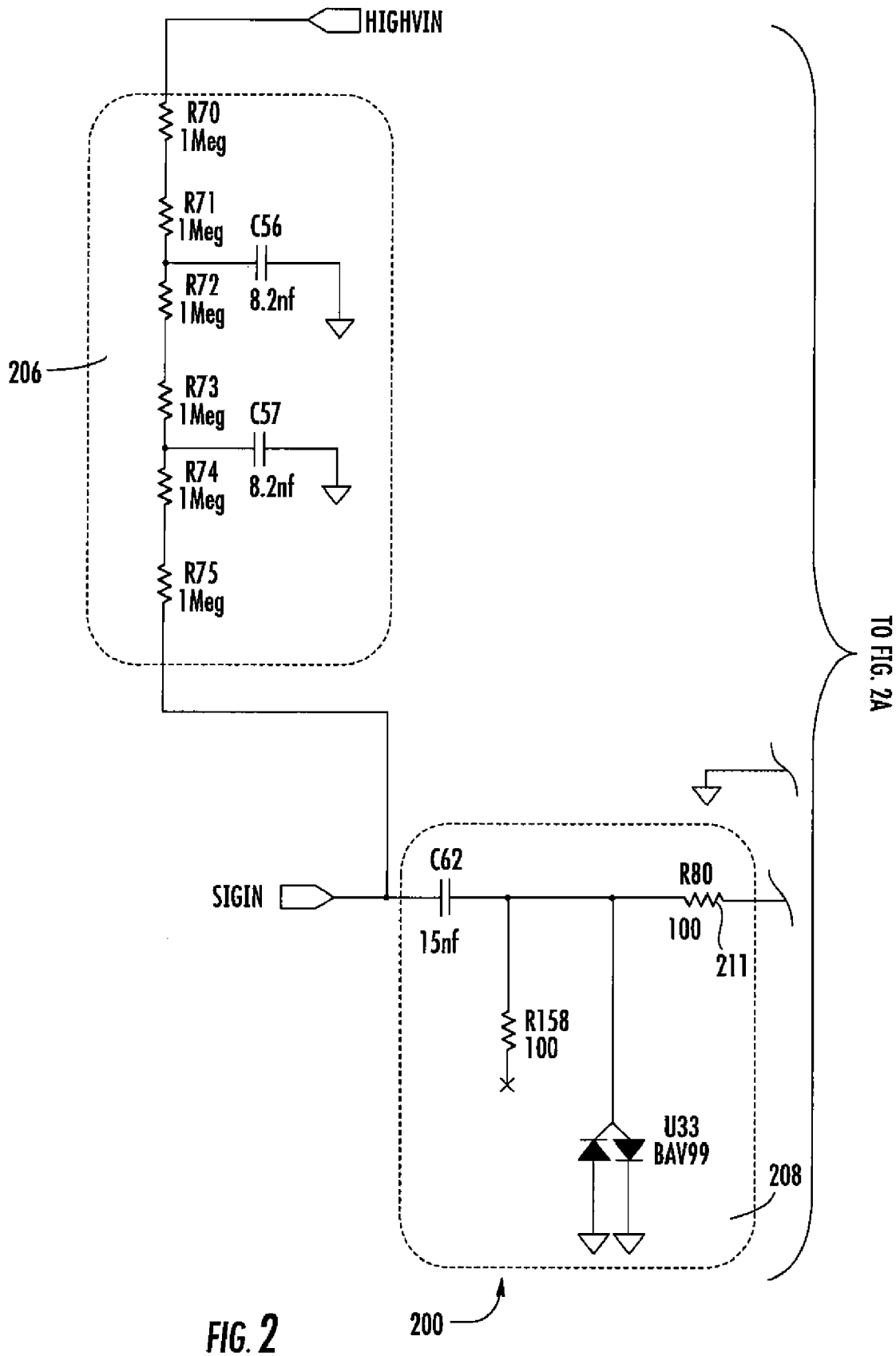
FIG. 2 shows a schematic of preamplifier circuitry according to an embodiment of the present invention.
Figure 2A:
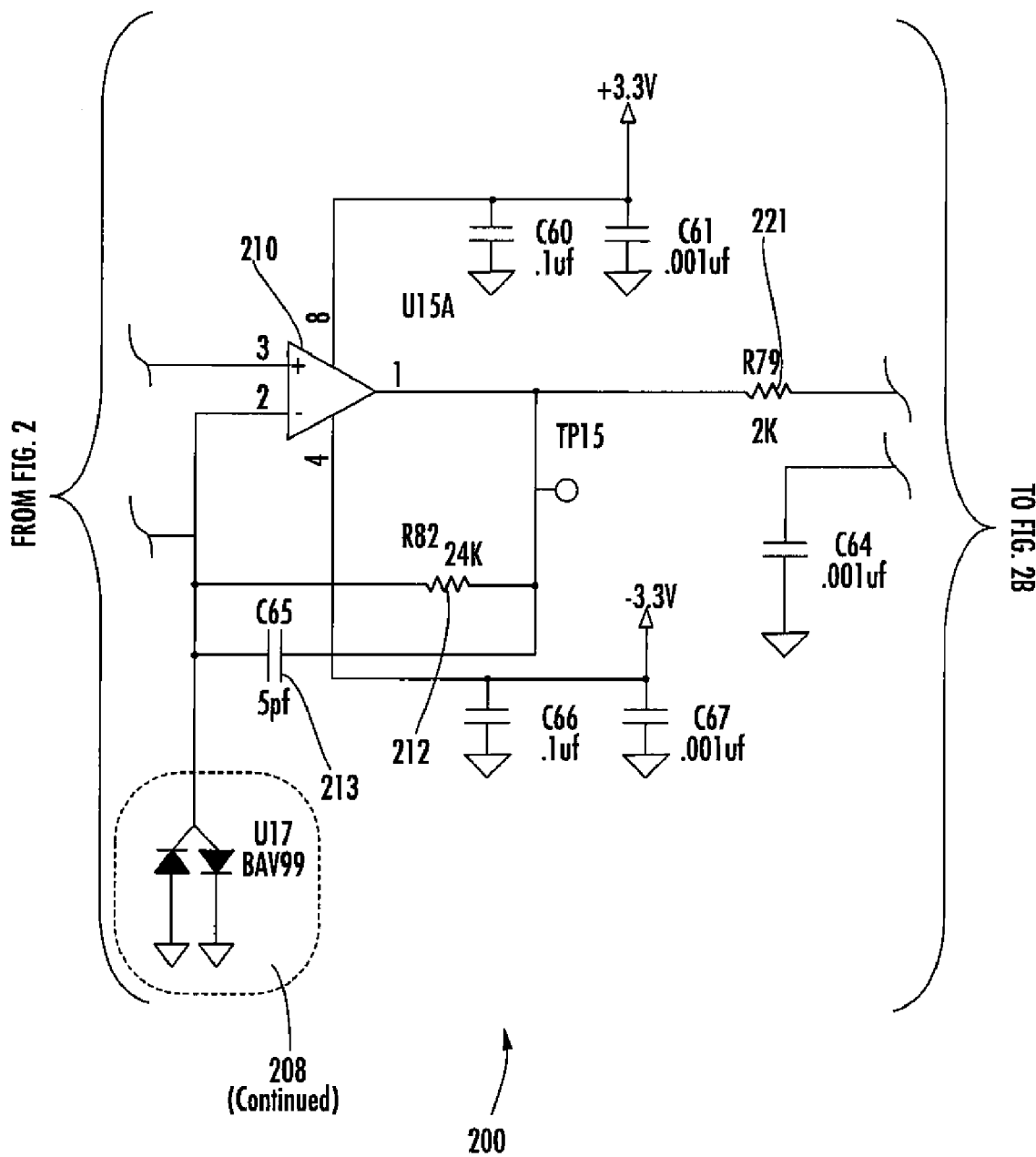
Figure 2B:
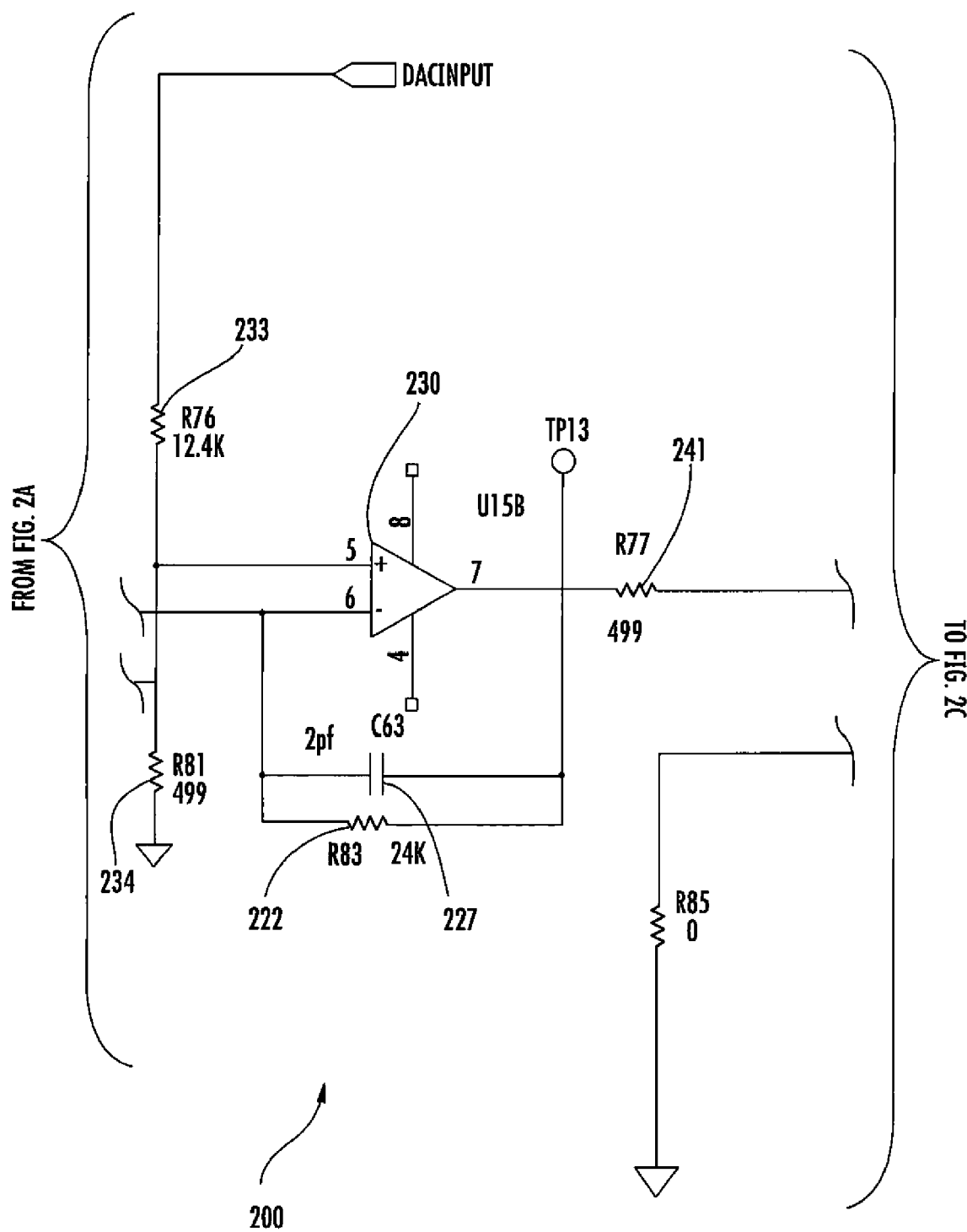
Figure 2C:
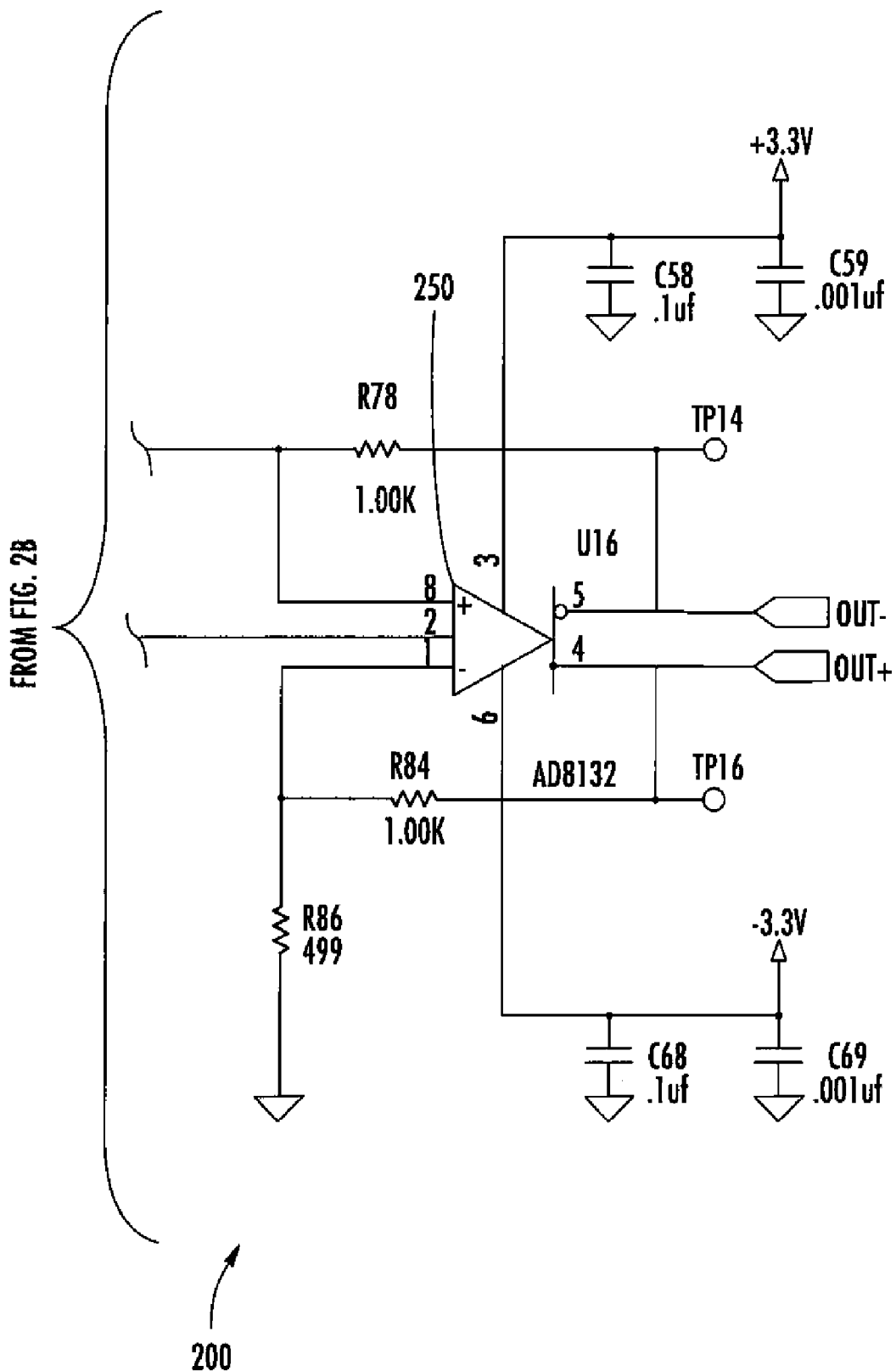

A preamplifier circuit description regarding a particular non-limiting inventive embodiment 200 is shown schematically in FIG. 2. Unless noted otherwise, component selections (such as bipolar as opposed to MOS) and values actually shown, are only exemplary values. SIGIN shown in FIG. 2 is a signal from the detector (not shown).

1) Front end amplifier 210 shown is a bipolar operational amplifier. The connection of the input signal received from a detector (not shown) via R 211 to inverting input (pin 2) of amplifier 210 along with feedback resistor R 212 and capacitor C 213, create a transimpedance amplifier of high speed whenever the feedback resistor R 212 is kept below about 100K ohms. Unlike the state of the art preamplifiers for detectors where the feedback resistor R 212 is typically much larger (>1 Meg ohms), this first amplification stage does not integrate the input charge/current. Instead, the output of this stage is a voltage proportional to the input current at pin 2. i.e. Vout (t)=cIin(t) where c is a constant. Amplifier 210 and its associated components thus implement a transimpedance function. However, if the total capacitor impedance, whether parasitic or intentional, dominates the feedback loop, then the amplifier 210 will not function as a transimpedance amplifier. At what frequencies and at what values of resistance this occurs at depends primarily on the op-amp choice and on the output impedance of the detector.

2) Second amplification stage. The output from stage one provided by amplifier 210 is D.C. coupled to the second amplification stage via resistor R 221. This resistor along with R 222 determines the dc voltage gain of the second stage. The capacitor C 227 is used for stabilization of the op-amp 230. Resistors R 233, R 234 and the reference voltage DACInput allows compensating the voltage and current offsets of the second and first stages such that the zero signal output from the second stage is near zero volts. The method for "trimming" the output voltage from the second stage can be done either by modification of the particular value of R 233 (which can be different for each channel) or by modification of the reference voltage DACinput. This can be done programmatically if DACinput is generated from a Digital to Analog converter. No pulse shaping is done in the second stage shown in FIG. 2. As noted above, typically (current state of the art) this stage would be a pulse shaping filter of the Gaussian type.

3) Final output stage. The output of the second amplification stage (output of Amplifier 230) is coupled via R 241 to a differential final output stage. The purpose of the final stage is to drive the amplified signals on twisted pair wires. Such signals a known to provide common mode noise rejection. Resistors R78,R77,R84,R85,R86 set the gain and common mode output voltage for amplifier 250. Out− and Out+ are preferably connected to a suitable twisted pair connector. In the preferred embodiment this would be an RJ45 connector allowing the use of low cost Ethernet cabling.

4) Input and protection circuitry. Capacitor C62, Resistors R80, R158 and diodes U33 and U17 make up the input and protection circuitry (collectively 208). C62 is a high voltage capacitor of nominally large capacitance. This protects the low voltage electronics from the high voltage that biases the detector. Resistors R158, R80 couple the a.c. current to the transimpedance stage amplifier 210. These resistors in addition to providing protection to the input stage of amplifier 210, also provide a new method for flattening the frequency dependent input resistance the input stage (thus improving both linearity and resolution). This is important because of the low output resistance of the detector (generally about 5,000 ohms). The diodes U33, U17 clamp excursions of the input voltage to ground. The resistors (R158,R80) and diodes U33, U17 create a new protection scheme that protects the circuitry from high voltage arc flashing when operating under vacuum. (Such arc flashing can occur with unexpected loss of vacuum).

5) High Voltage Bias String: Resistors R70-R75 206 and high capacitors C56,C57 (collectively 206) provide a high voltage bias string for the detector. The use of series coupled resistors rather than a single resistor (which is the current state of the art) lowers the equivalent capacitance of the resistance thereby providing better noise rejection.

Figure 3:
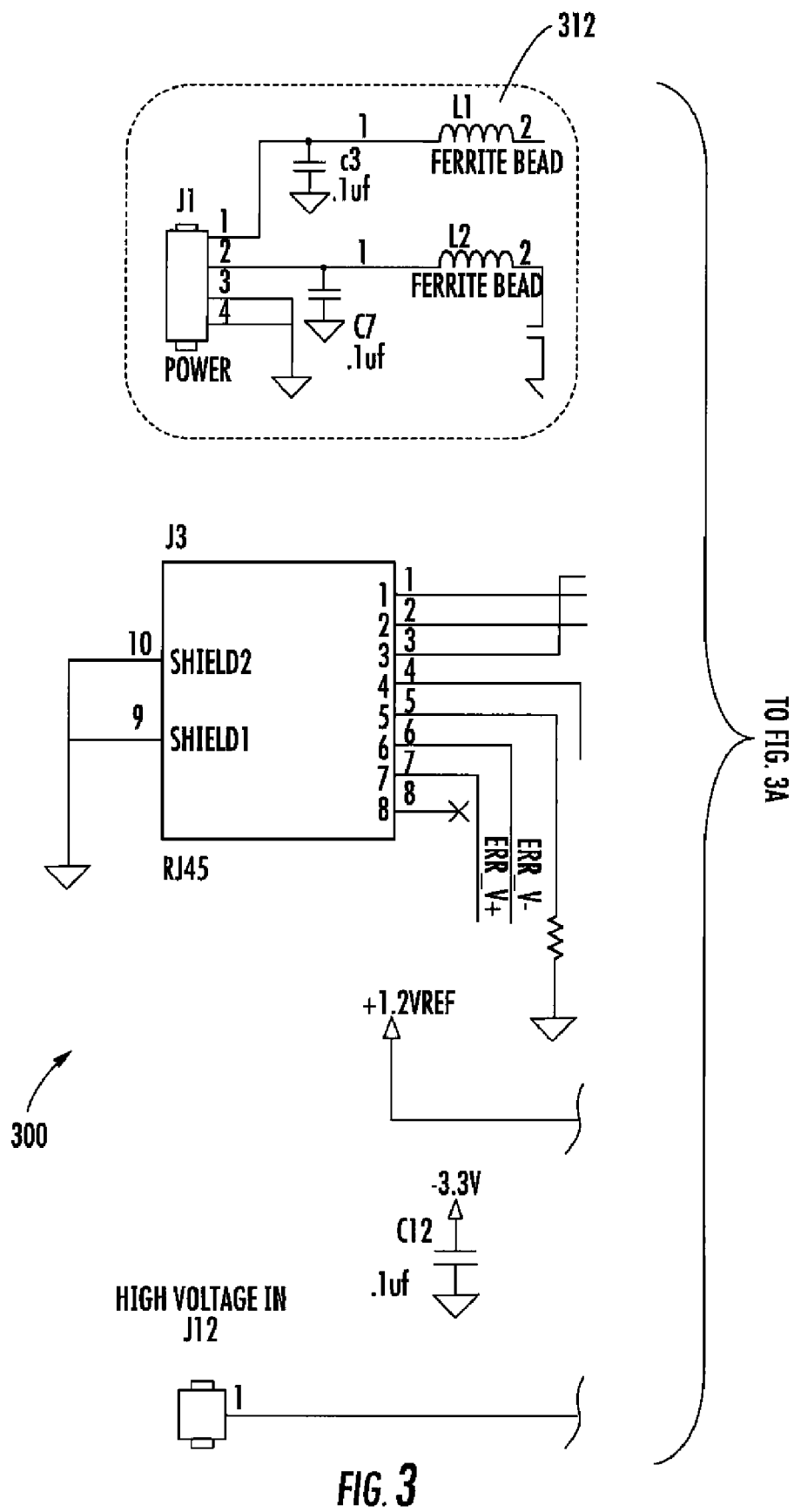
FIG. 3 shows a schematic of an eight pack preamplifier embodiment along with exemplary support circuitry according to the present invention.
Figure 3A:
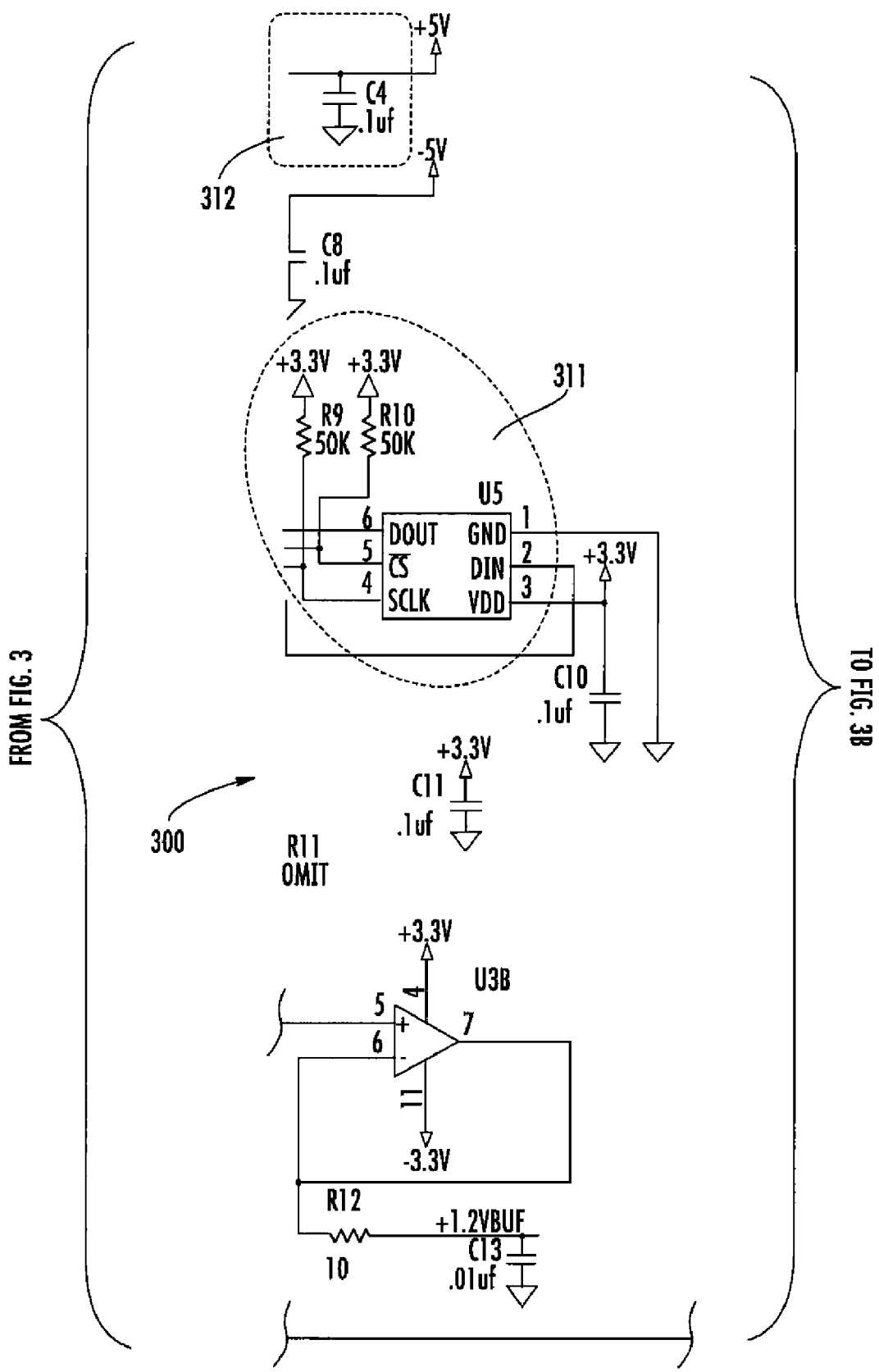
Figure 3B:
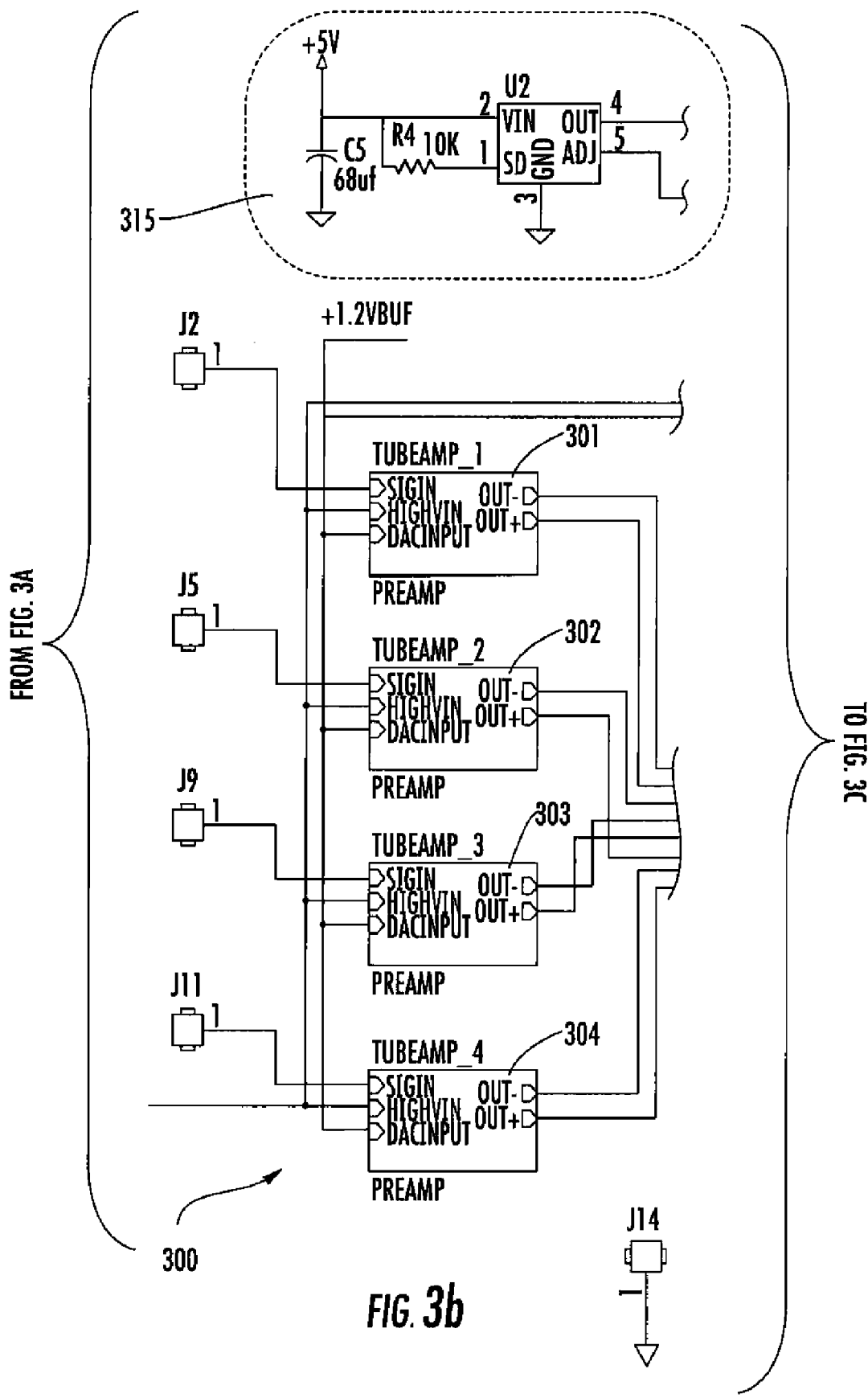
Figure 3C:
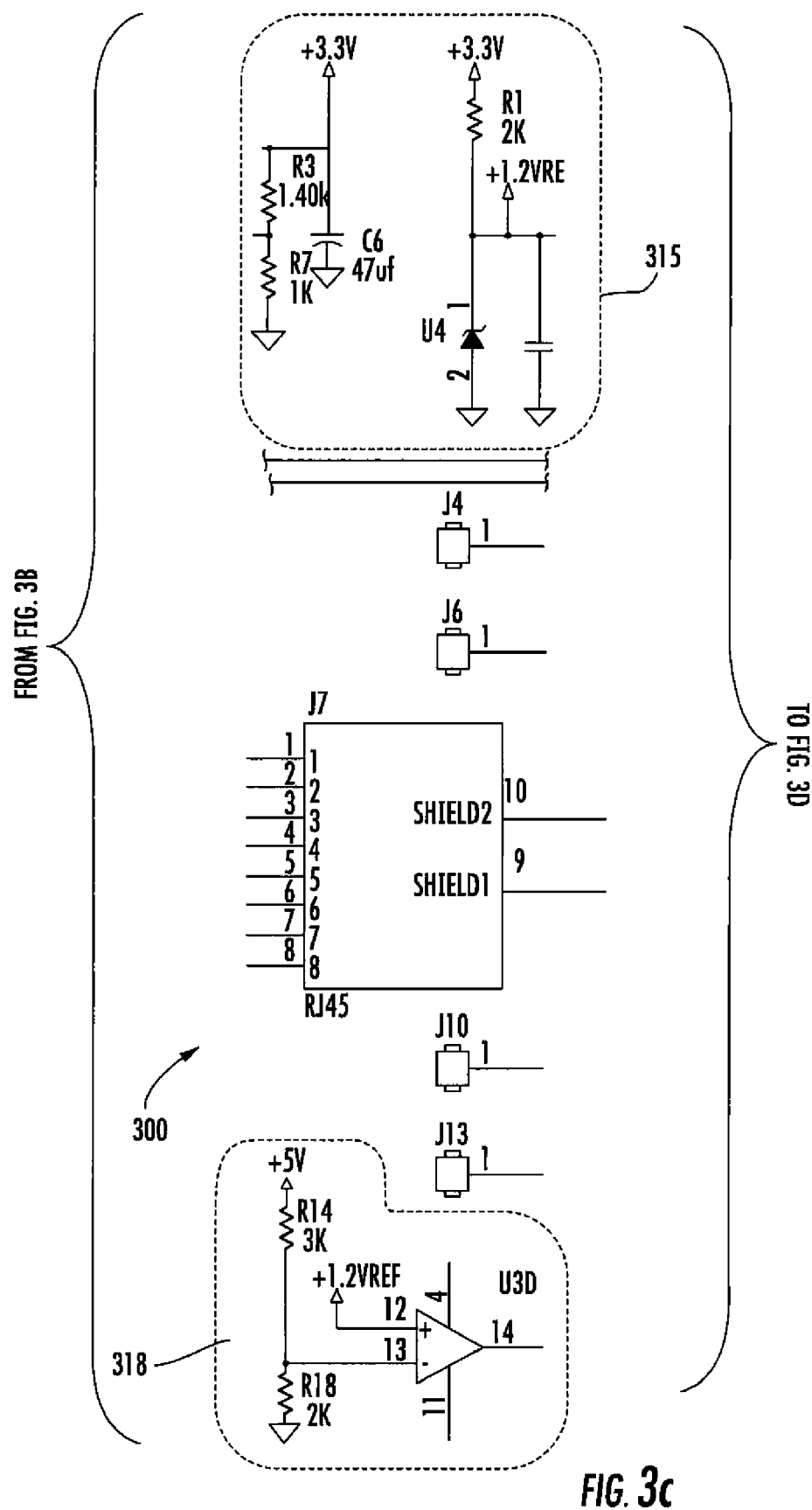
Figure 3D:
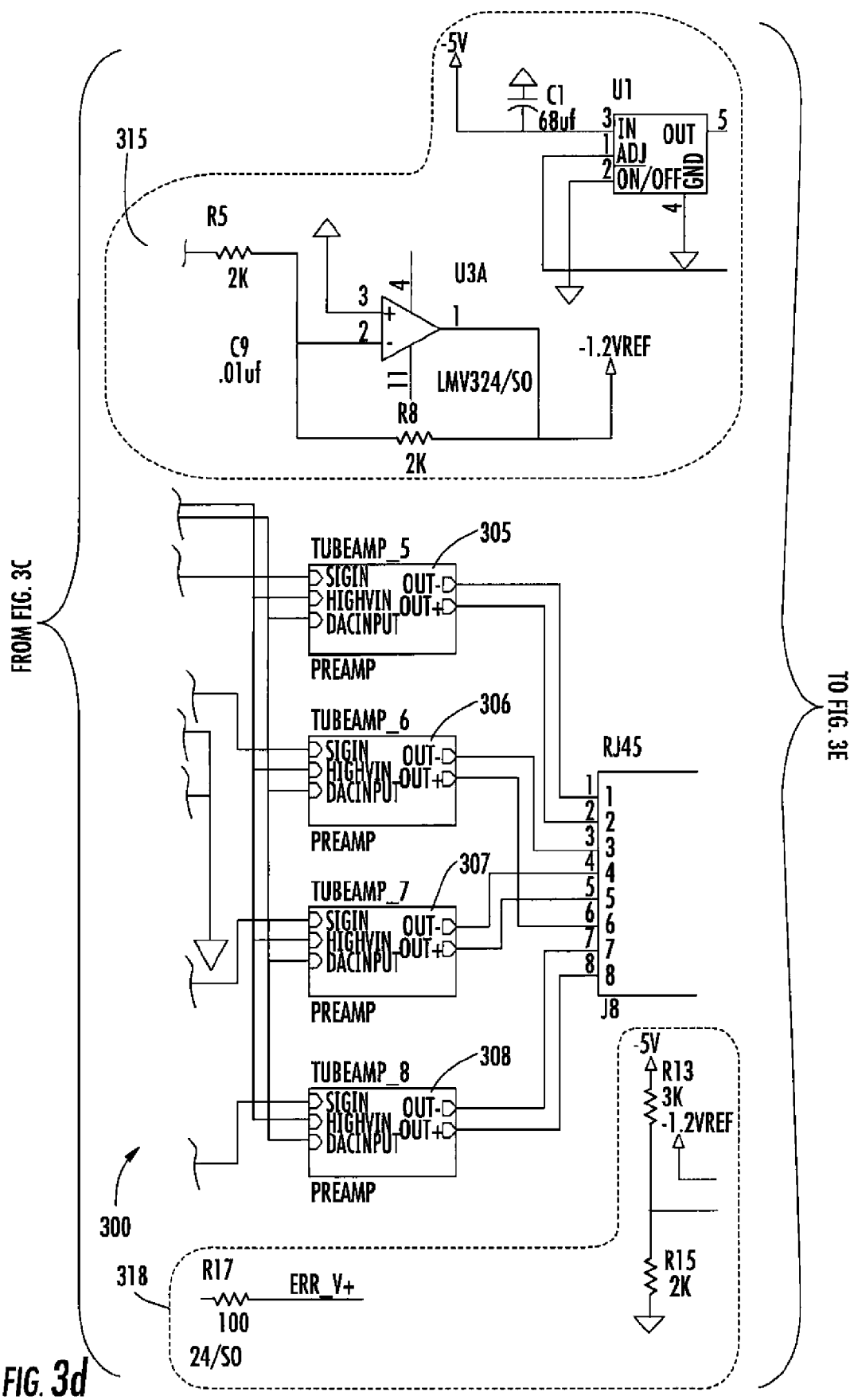
Figure 3E:
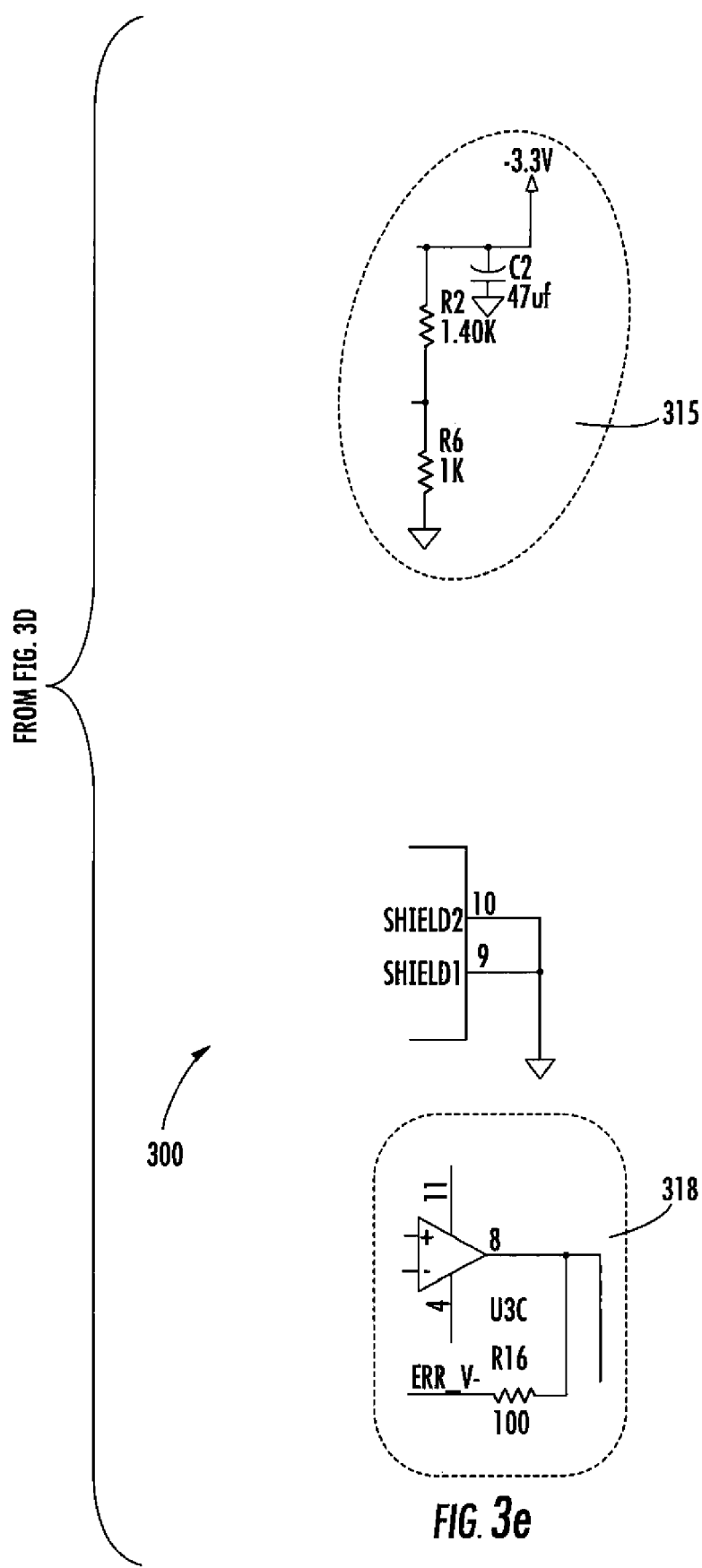

FIG. 3 shows an eight pack (channel) preamp embodiment circuit schematic 300. In FIG. 3, the already described preamplifier circuitry shown in FIG. 2 is replicated eight (8) times, and is denoted as 301-308, having detector input signals in (SIGIN) coupled thereto, high voltage in (HIGHVIN) and D/A converter input (DACINPUT; as noted above for offset trimming), as well as outputs OUT1 and OUT2, (all also shown in FIG. 2). The balance of the support circuitry is described below.

Regarding connectors, J12 is the high voltage connection which supplies the high voltage filter circuitry 206 described above. J2,4,5,6,9,10,11,13 provide connections for the detector outputs to couple to the SIGIN input. J14 provides a ground connection for the mounting chassis. In the preferred embodiment these are vias on the preamp circuit board.

J7 and J8 are connectors for the output signals from the preamplifier sections while J3 is a connector that allows reading of the local board temperature and of the supply voltage status. In the preferred embodiment these are RJ45 Ethernet connectors.

J1 is the power input, two voltages and ground. In the preferred embodiment the voltages are nominally +−4.0V.

U5 and associated bias resistors R9 and R10 (collectively 311) provide the ability to read the local temperature of the preamp board. L1,L2,C3,C4,C7,C8 (collectively 312) provide noise filtering of the input power voltages while U1,U2 and their associated passive components (collectively 315) comprise the systems for regulated supply voltages of +−3.3 Volts to the rest of the electronics.

U3C and U3D and the associated resistor dividers R13,R15 and R14,R18 (collectively 318) provide a method for monitoring the supply voltage. The output of the operational amplifiers goes to a high voltage state whenever the input voltage falls below a value which can be regulated by U1 and U2.

U3A, U3B and U4 along with their associated passive components provide a reference voltage for the D.C. compensation in the preamplifier. This voltage is equivalent to DACInput shown in FIG. 2.

The use of low-voltage op-amps and a minimum of circuitry allow this system to be operated in vacuum. Each eight detector pre-amp board draws in the preferred embodiment about 1.5 Watts of power which results in a rise in temperature of about 5 degrees Celsius in vacuum.

Although described as a circuit board realization, the active components of the pre-amplifier circuits, such as op-amps, reference voltage and temperature sensor, according to the present invention can be integrated on a single chip.

Figure 4:
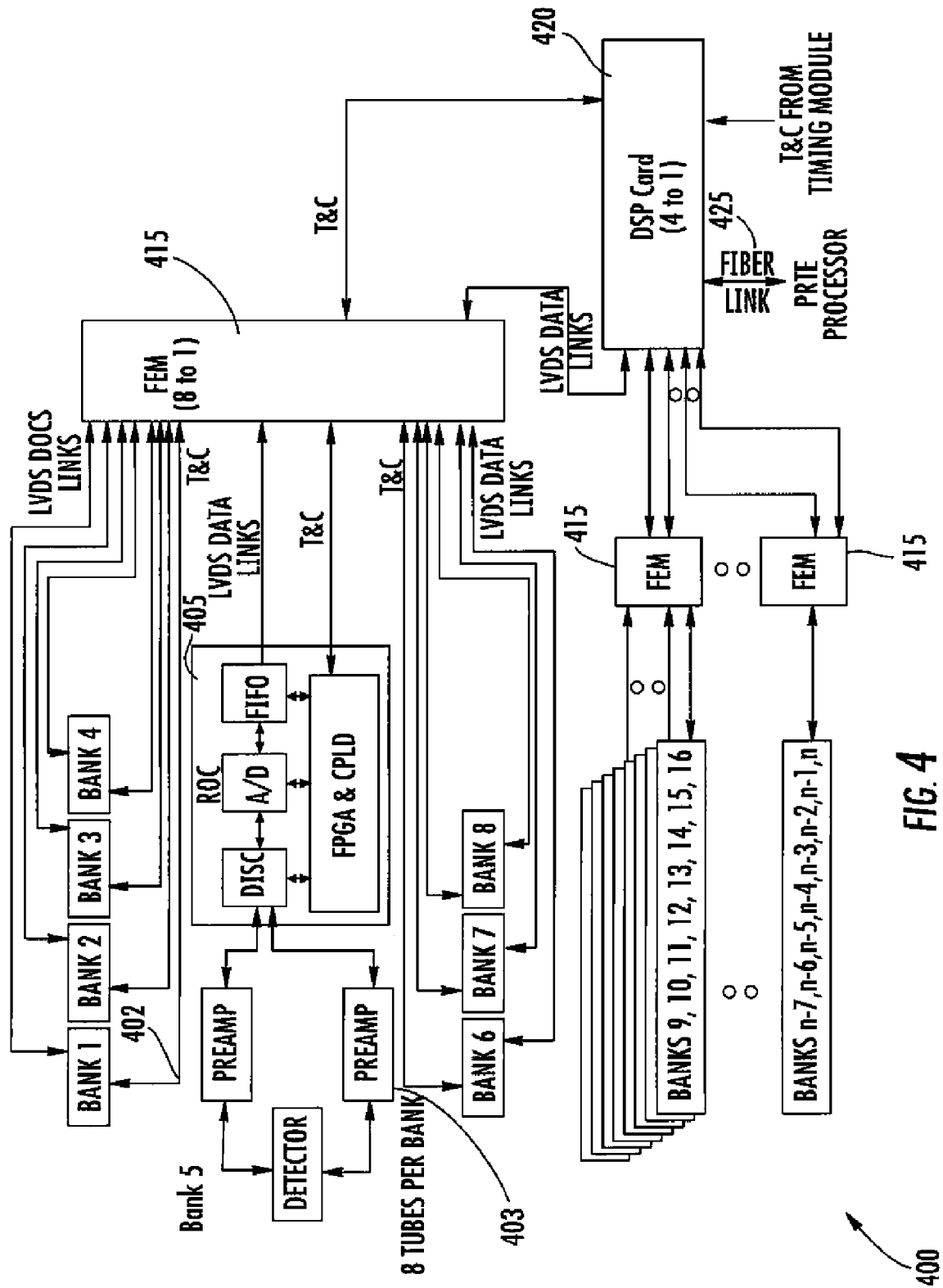
FIG. 4 shows a detector electronics overview and related communication links.

FIG. 4 shows a detector electronics overview and related communication links 400 according to an embodiment of the present invention. Each bank consists of 8 tubes that interface to two 8-channel preamplifier cards (1 for each tube end). The two preamplifier cards 402 and 403 associated with each tube/detector 401 are each connected to a Read Out Card (ROC) 405. The ROC processes pulses from the preamplifiers 402 and 403, digitizes and time-stamps them and forms data packets for transmission. Groups of up to eight ROCs are connected to a single Front End Module (FEM) 415. The FEM 415 distributes timing and control signals from the DSP card 420 and collects data from the ROC 405. Thus a FEM 415 collects data from up to 64 tubes. The FEM retransmits the data to the DSP card 420 that in turn transmits it to the pre-processor via a fiber optic link 425.

Figure 5:
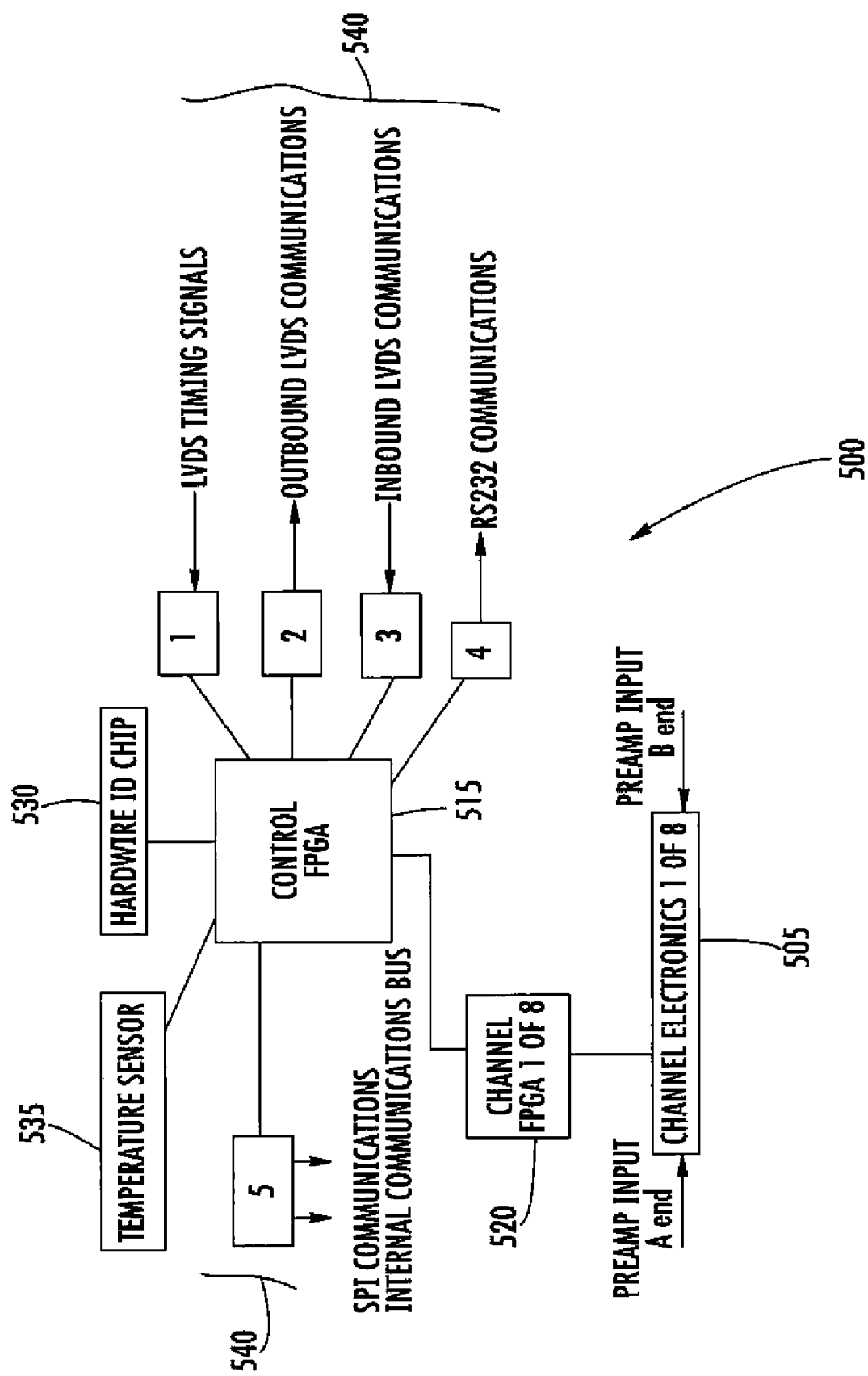
FIG. 5 shows a block diagram for exemplary front end circuit according to the present invention which utilizes differential amplifiers for converting the differential signal received from the preamplifier circuitry into a single ended voltage signal.

FIG. 5 shows a system level block diagram description of the preferred ROC 500 embodiment. Details of the individual channel electronics 505 are further explained below. In the preferred embodiment the signal processing electronics comprises a control field programmable gate array (FPGA) 515, eight channel FPGAs 520 (one for each channel), eight channel electronics (one for each channel) 505, a hardware identifier chip 530, temperature sensor 535 and various communication links (shown as boxes/links 1-5; collectively 540).

The control FPGA 520 is responsible for the following:
a) Coordination of information to and from the channel FPGAs 520 via the internal communications bus. In other embodiments of the invention the channel FPGA's 520 and the control FPGA 515 may be combined into a single larger FPGA.
b) Handling of various external commands received from box 3.
c) Transmission of data and status via the external link 2
d) Synchronizing data acquisition with various timing signals received on external link 1. Note that links 1,2,3 use RJ45 connectors thereby allowing the use of low cost Ethernet cabling.
e) Handling of SPI and RS232 serial communication on link 5 and 4.
f) Reading of the hardware I.D. chip and using this as a unique communications address.
g) Reading of the temperature sensor 535. This is most useful when operating in vacuum as it allows one to determine if the board's temperature exceeds operational specifications.
h) Calculation of the detected neutron's position.

Whenever a neutron is detected by the channel electronics 505, this information is transferred to the control FPGA 515. At this point, the control FPGA 515 calculates the position of the neutron. The result from this calculation along with the timestamp, also delivered by the channel FPGA (see below), is then output on the lvds link 2 shown in FIG. 5.

Channel electronics 505 are now described, beginning with a brief description of how a neutron signal is detected by the channel electronics. In general to determine the position of a neutron, two signals must be provided. In the current embodiment, these signals are labeled as preamp input A end and preamp input B end as shown in FIG. 5. These are the amplified signals originating from each end of a linear position sensitive tube (detector). These signals are summed together providing a voltage signal that is used to trigger a discriminator. The discriminator will trigger, i.e. output a logic high voltage output, whenever the sum signal exceeds a predetermined magnitude. The channel FPGA 515 monitors the discriminator output and whenever it triggers, the channel FPGA starts integration of the neutron signal pulse from each of the preamp channels (A, and B).

This is preferably accomplished by integrating a delayed signal. This delayed signal allows time to start the integration circuitry (triggered off the un-delayed signal) prior to the arrival of the delayed signal pulse. By using a pipelined integrator one can read and store the baseline preamp signal values prior to the start of integration. This is important for use in dynamic baseline correction techniques. In addition, by monitoring the sum signal one can dynamically change the integration time. This is important for neutron detection due to the wide varieties of pulse widths, improving the overall signal to noise ratio by matching the integration time to the pulse width. The channel FPGA 520, in addition to measuring the baseline and integrated voltages on channels A and B, also timestamps the neutron event. The timestamp is defined as the time difference between a synchronization pulse and when the neutron is actually detected. The baseline and integrated values along with the timestamp are sent to the control FPGA 515 which performs the position calculation. The synchronization pulse and timestamp clocks are sent to each channel FPGA 520 from the control FPGA 515.

Figure 6:
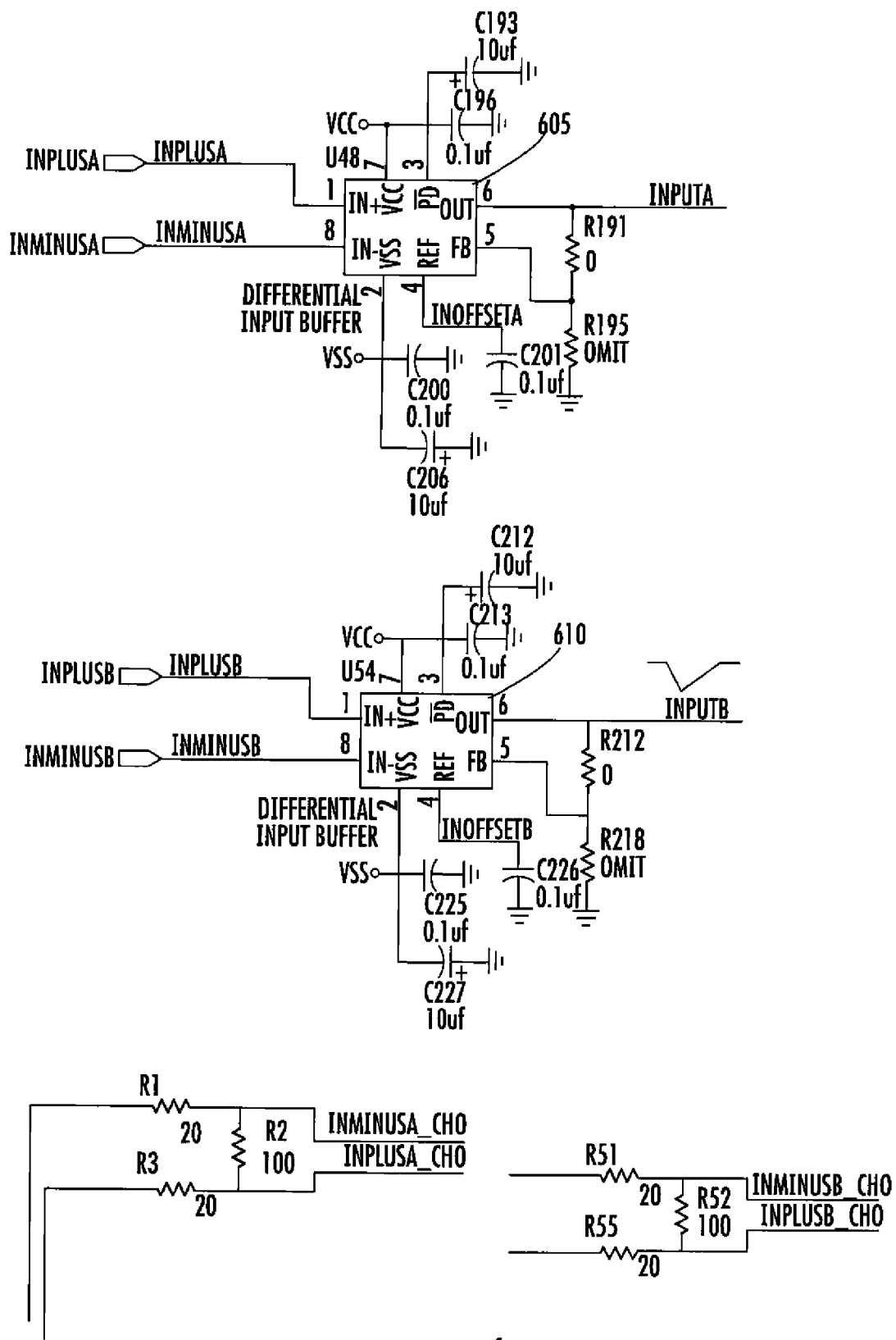
FIG. 6 is a schematic for exemplary front end electronics according to the present invention responsible for converting the differential signal received from the preamplifiers into a single ended voltage signal.

FIG. 6 is a schematic for exemplary front end electronics responsible for converting the differential signal received from the preamplifiers into a single ended voltage signal. There are two differential inputs (PLUS and MINUS for both A and B) for each side of each linear position tube (e.g. see FIG. 4; preamps 402 and 403 associated with tube/detector 401), denoted as channel A (INPLUSA and INMIMUSA) and channel B (INPLUSB and INMIMUSB). Resistors R2 (A) and R52 (B) are responsible for terminating the differential signal line from the preamplifier and R1,3 (A) and R51,55 (B) are used for decimation of the signal, if necessary. Differential amplifiers 605 and 610 convert the differential signal (corresponding to OUT− and OUT+ in FIG. 2) to a single ended voltage signal which is processed by the rest of the electronics. The offset outputs of differential amplifiers 605 and 610 can be adjusted by the output from a programmable digital to analog converter (DAC). The programmable DAC (not shown in FIG. 6) is programmed by the channel FPGA, also not shown in FIG. 6. The output of differential amplifier 605 (pin 6) and differential amplifier 610 (pin 6) are fed into the gain balance/summer stage (described relative to FIG. 7 below). The output of differential amplifier 605 is also fed into the integration stage for channel A while the output of differential amplifier 610 is fed into the integration stage for channel B.

Figure 7:
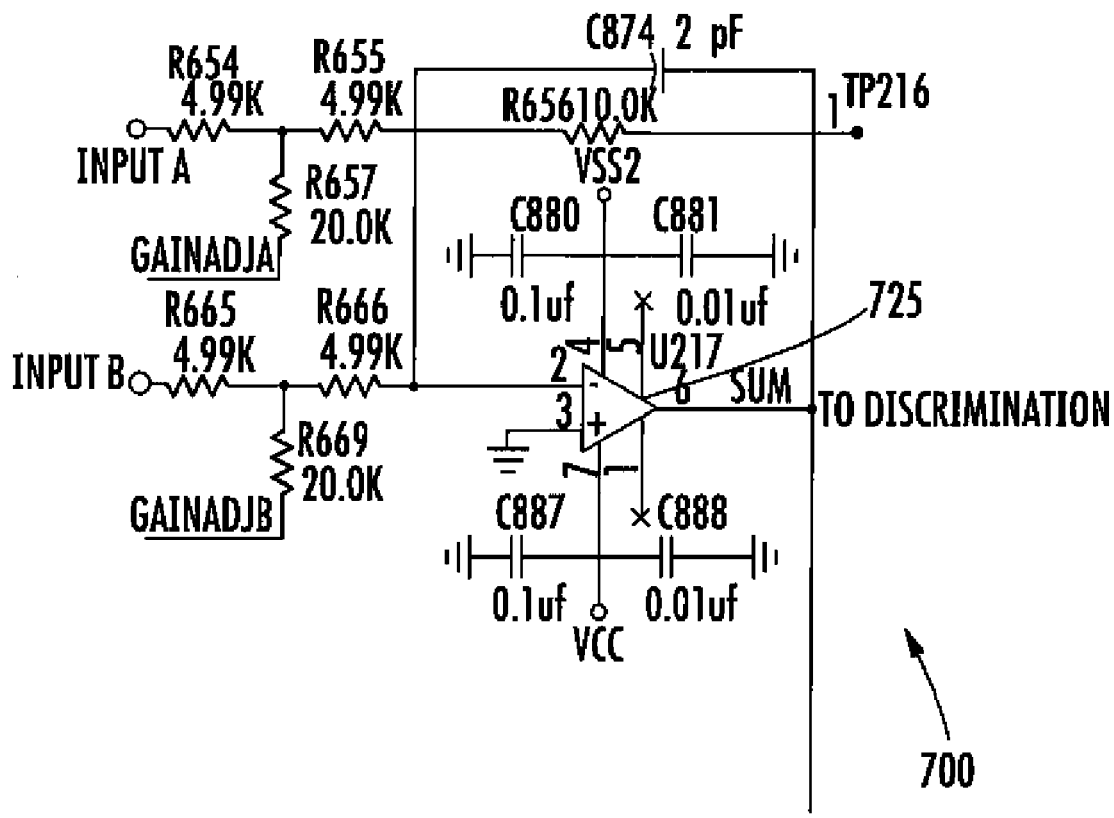
FIG. 7 is a schematic showing an exemplary gain balance/summer circuit according to the present invention.
Figure 7:
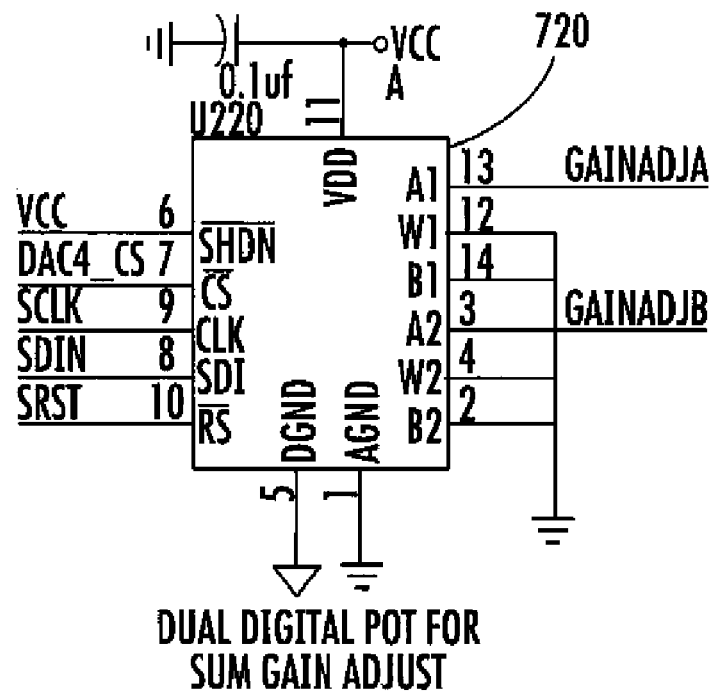

FIG. 7 shows the schematic of an exemplary gain balance/summer circuit 700. Resistors R654,655,657,665,666 and 669 along with the digital potentiometer 720 which provides programmable impedance to allow balancing the gains of the A and B channels prior to the summer circuit comprising R656 and operational amplifier 725. Outputs GAINADJA and GAINADJB from digital potentiometer 720 are coupled to op amp 725 as shown in FIG. 7. After balancing, each channel (A and B) will have equal probability of causing the discriminators (described relative to FIG. 8) to fire, thus balancing the probability of neutron capture and detection at each end of the linear position tube/detector. This gain adjustment is done by changing the resistance of the digital potentiometer 720 between 0 and typically 100 kohms to ground using digital pot shown 7. Those having ordinary skilled in the art will recognize amplifier 725 and its associated resistors comprise a well known summer circuit. The summed output from amplifier 725 (pin 6) is output to the discriminator stage.

Figure 8:
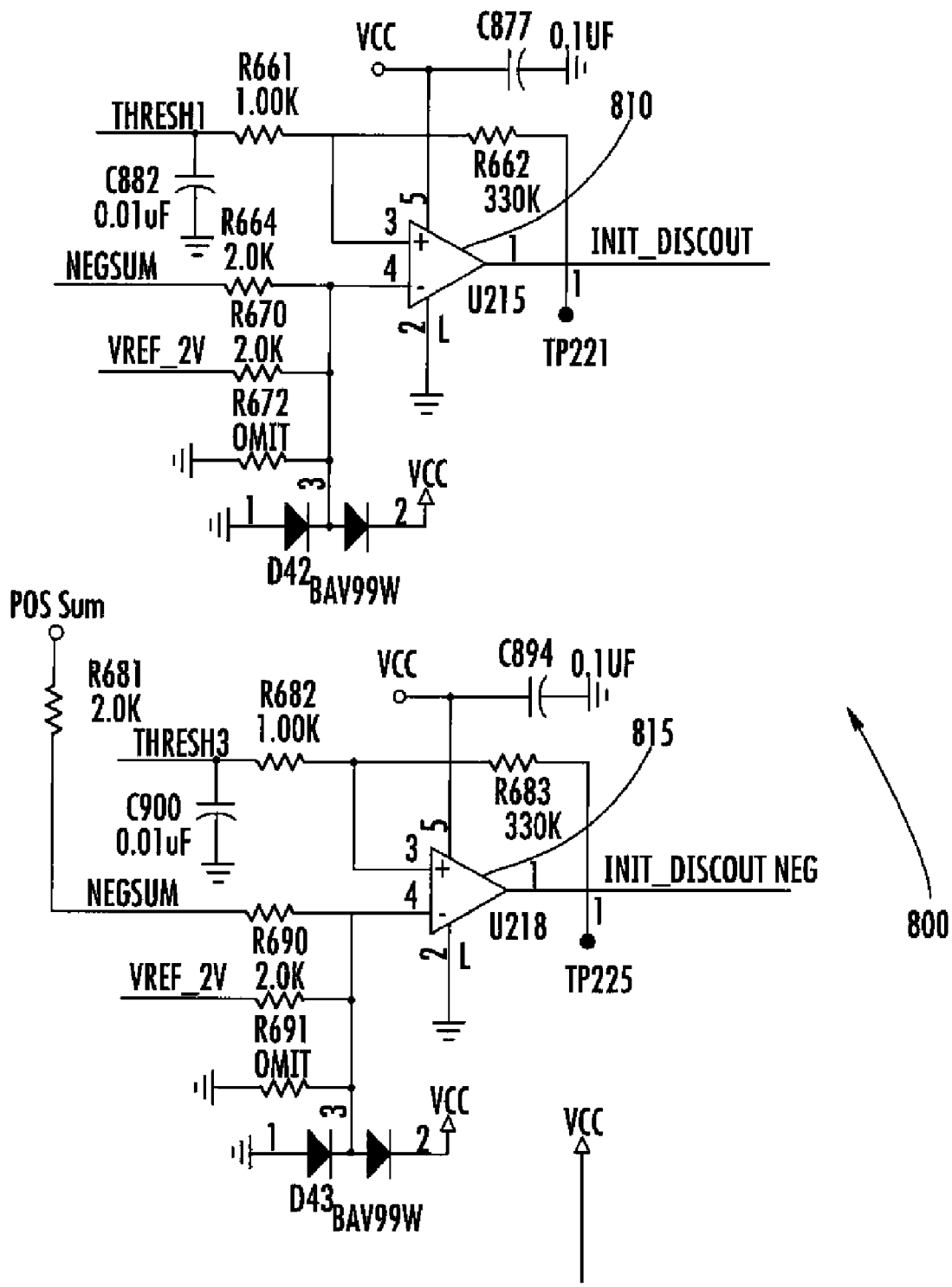
FIG. 8 shows the schematic for an exemplary differential discriminator stage according to the present invention.

FIG. 8 shows the schematic for an exemplary discriminator stage 800 that may be used with the present invention. The discriminator stage comprises two high speed comparators. One high speed comparator 810 is for neutron signal detection and one high speed comparator 815 is for noise detection. The circuitry for the neutron signal detection 810 is described below. It is noted that identical circuitry can be used for the noise detection circuit, except that the output from the discriminator stage is first inverted prior to being input to the noise detection comparator 815. The resistors R664,670 provide level shifting of the input signal for comparator 810. D42 clamps the input to the power supply rails providing over voltage protection to the comparator. R661,662 and the reference voltage denoted as threshold1 provide a reference voltage with hysteresis for U215.

The action of each comparator 810 and 815 is to produce a voltage that is considered a logical one by FPGA logic (not shown in FIG. 8, see FIGS. 4 and 5) whenever a neutron is detected. Whenever a signal of opposite polarity from a detected neutron is received, such as is the case with noise, comparator 815 outputs a logical one. The detection of logical one on comparator 810 starts the timing of the integration circuits described below relative to FIG. 9. It also causes the channel FPGA to store the value of a timestamp counter which can be used to determine the time-of-flight of the detected neutron. The detection of a logical one from comparator 815 by the channel FPGA will cause the signal to be rejected. This rejection mechanism is important because many different types of noise will also cause comparator 810 to falsely trigger. The threshold signals threshold1 and threshold3 are preferably set by the outputs from a programmable digital to analog converter (DAC).

Figure 9:
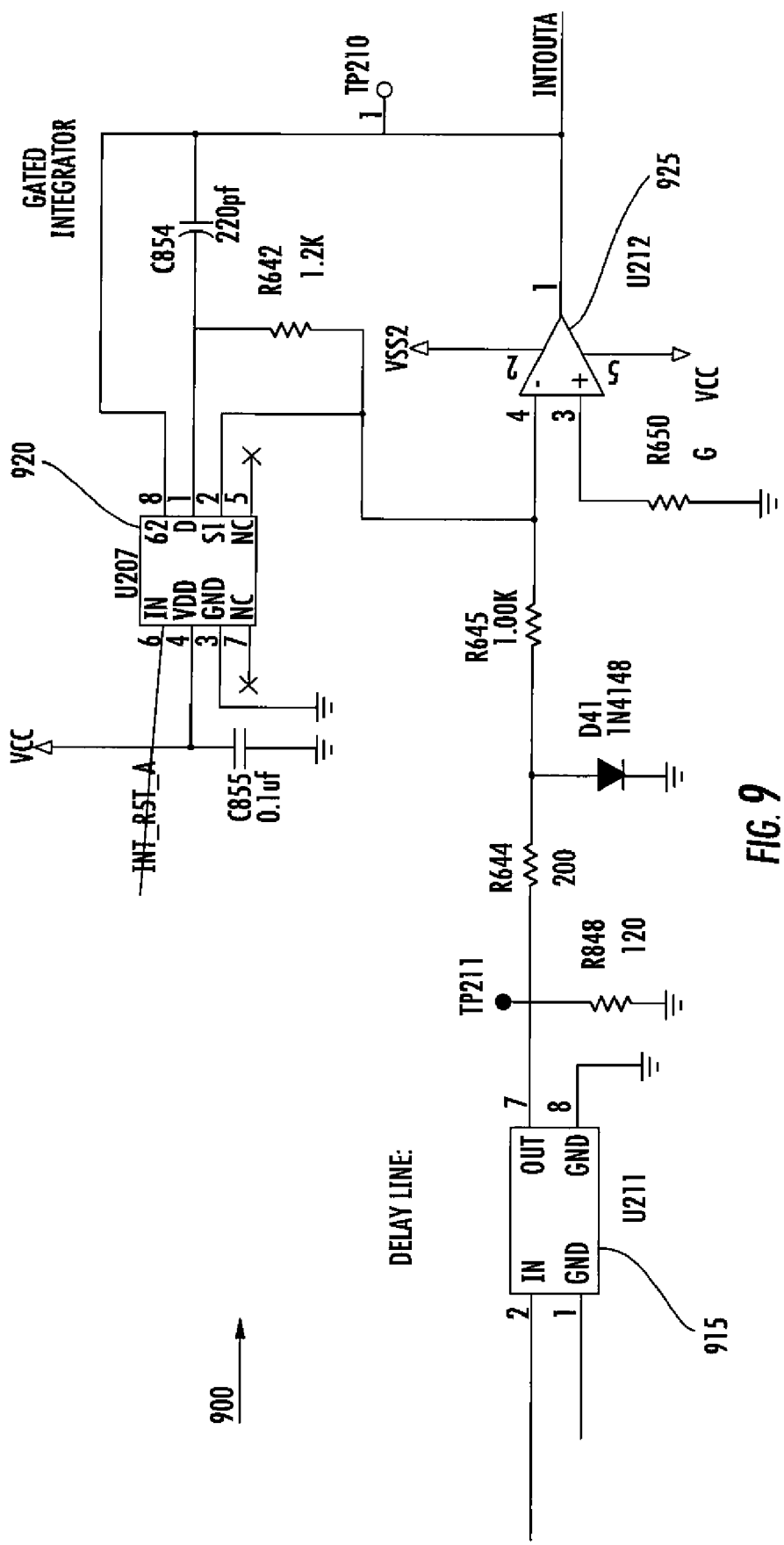
FIG. 9 shows an exemplary integration circuit according to the present invention. There are separate identical integration stages for channels A and B.

FIG. 9 shows an exemplary integration circuit 900 according to the present invention. There are separate identical integration stages for channels A and B. Only the integration circuit for channel A is described relative to FIG. 9. Outputs from the input stage of FIG. 6 are input into the delay line 915. This delay line 915 delays the input signal giving the digital circuitry in the channel FPGA time to act on the switch 920. If the FPGA determines that the signal from the preamp is a valid neutron (based on the output from the discriminators, specifically comparator 810 being high), it will start the integration of the input signal at a time based on programmable settings. The output from the delay line is input into the integration circuit comprising op amp 925, switch 920, capacitor C854 and resistors R642,644 and 645. Resistor R648 terminates the delay with the correct line impedance, while R644,645 and C854 determine the gain of integrator. Prior to the assertion of the signal from the discriminator circuitry 800 the switch 920 is closed thereby placing the integration circuit into unity gain mode. (Those having ordinary skill in the art will recognize R642, R644,645 and the op-amp 925 has a unity gain amplifier). When in unity gain mode, one can determine the baseline voltage prior to the start of integration. Such baseline determination is also known as correlated sampling. If the digital circuitry in the channel FPGA determines that the signal is a neutron, then the switch 920 is open forming an integrator. After a programmable integration time, the switch 920 is again closed, removing the integrated charge from capacitor C854. At this point the circuit is ready for another neutron pulse. The output from the integration stage 900 is input into the analog to digital stage described relative to FIG. 10.

Figure 10:
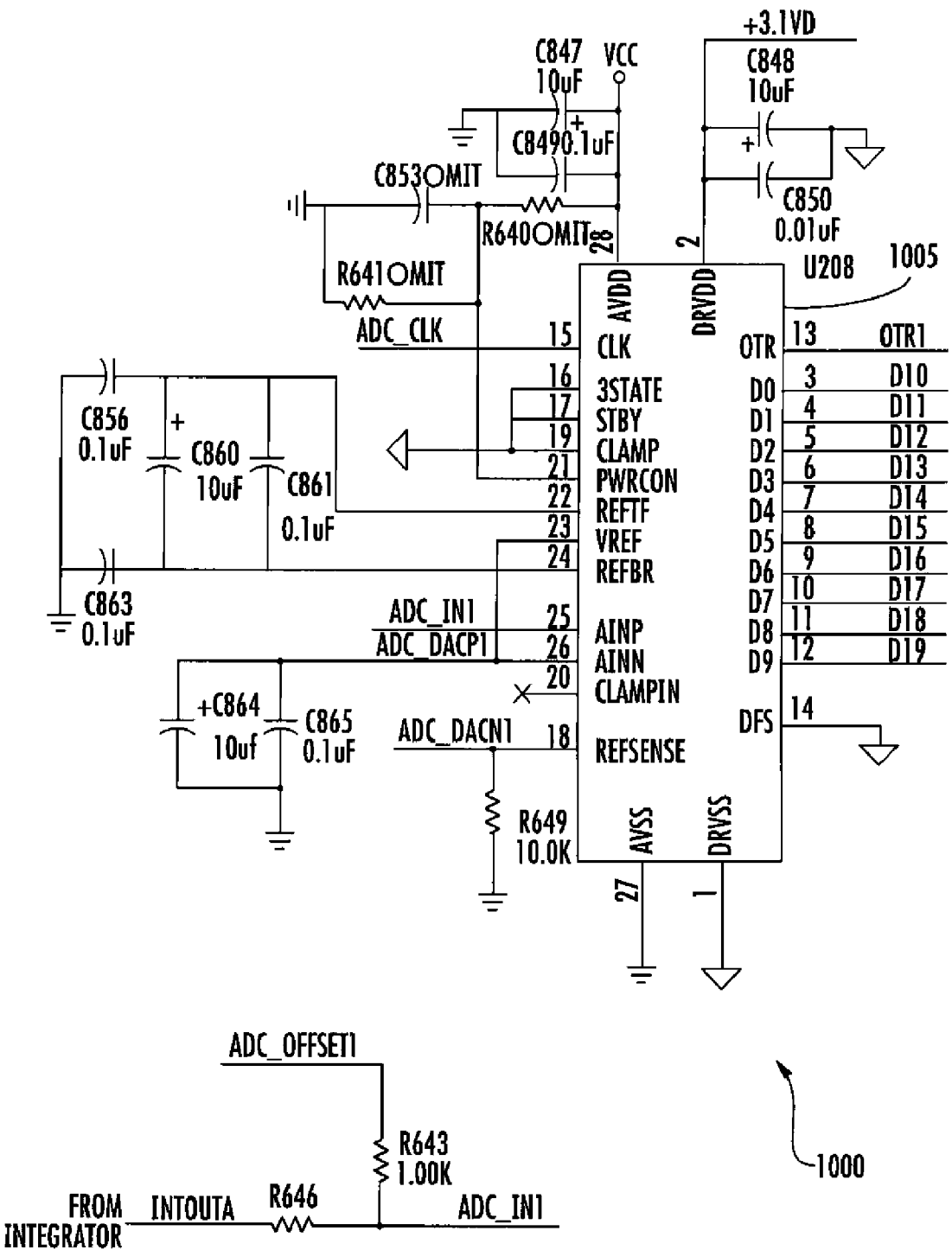
FIG. 10 shows the schematic for an exemplary an analog to digital conversion stage according to the present invention.

FIG. 10 shows the schematic for an exemplary an analog to digital conversion stage 1000 according to the present invention. The analog to digital stage comprises digital converter (ADC) 1005, reference inputs ADC_DACP1 (to pin 26) and ADC_DACN1 (to pin 18), resistors R643,646 and reference voltage ADC_OFFSET1. Associated capacitors are power supply bypass capacitors. The reference voltage of the ADC is set by changing the impedance between ADC_DACP1 and ADC_DACN1. This is done by changing the impedance of a programmable potentiometer (not shown). This allows dynamic scaling of the ADC 1005. The reference ADC_OFFSET1 and resistors R643,646 allows setting the voltage offset from the integration stage to a value such that switching currents from switch 920 shown in FIG. 9 do not cause the integrator output (INTOUTA) to fall below ground at which point the ADC would not correctly record the signal voltage. This offset voltage is preferably programmable. The ADC 1005 is a pipelined converter thereby providing continuous values at every rising edge of the ADC clock signal. Which voltage values are recorded can be changed dynamically, along with the integration time, allowing users to improve the signal to noise values of signals whose bandwidth varies widely, such as is the case with neutrons.

Figure 11:
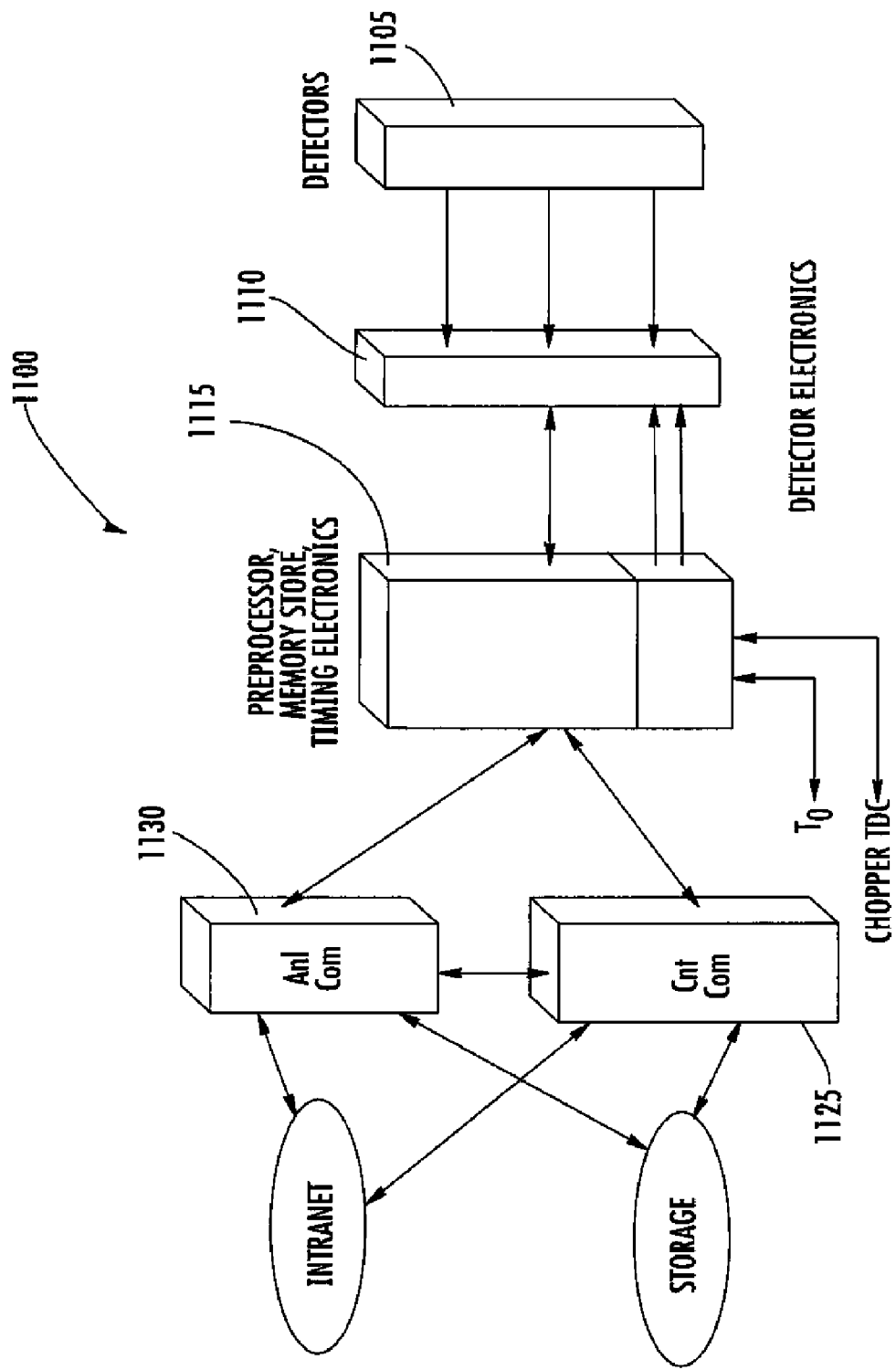
FIG. 11 shows a block diagram of an exemplary data acquisition system layout according to the present invention showing placement of the inventive detector electronics as one of the blocks.

Referring again to FIG. 4, the data from the respective control FPGAs are connected to a single Front End Module (FEM). The FEM distributes timing and control signals from the DSP card and collects data from the ROC. The FEM retransmits the data to the DSP card that in turn transmits it an external computer also known as the pre-processor via the fiber optic link shown FIG. 11 shows system blocks for an exemplary data acquisition system for a SNS 1100 showing placement of the inventive detector electronics 1110 therein, together with detectors 1105, preprocessor 1110, control computer 1125 and analysis computer 1130. As described above the detector electronics is responsible for signal conditioning of the analog signal from the detectors, analog to digital conversion of the signal, and assigning a unique position and time stamp for each detected neutron. The detector electronics 1110 also provides electronics required for transmitting the neutron event data to the preprocessor-memory ({PRM} store unit 1115. This transmission is preferably accomplished via a bi-directional high-speed data link.

The high-speed data link (represented by the double tipped arrow between the PRM 1115 and the detector electronics 1110) is preferably a fiber optic based data link. Data bytes representing detected neutron events are formatted in the detector electronics 1110, serialized and sent through the optical link in data frames. The data link also provides for data to be sent to the detector electronics 1110 from the PRM 1115.

The PRM 1115 acts as an interface between the detector electronics 1110 and the control computer 1125. PRM 1115 is responsible for storage of the raw or transformed data as determined to be appropriate for each instrument. Data can be transformed in real time from the raw event data. The preprocessor-memory store in PRM 1115 has the necessary lookup tables and processor speed to accomplish this goal. The PRM also acts as the communications link between the control computer 1125 and the detector electronics 1110. This link allows the control computer 1125 to download to the detector electronics information needed for proper operation such as look-up table data or discriminator settings.

Communication between the PRM 1115 and the control computer 1125 is accomplished through a data link of sufficient speed to transmit display data and/or histogrammed data in real time to the control computer. During periods of experimental idle time, the PRM may also be used in conjunction with the analysis computer and the control computer as a distributed computing system for the analysis of data. There is an additional point-to-point link from PRM to the analysis computer that can be used to transfer "raw" or histogrammed data to the analysis computer. This dual approach to data transfer not only doubles the potential data bandwidth, it allows flexibility in how data is displayed and transferred to the user.

The control computer 1125 is responsible for the control and sequencing of the experiment tasks. It is also responsible for monitoring parameters such as chopper phasing, sample temperature and other instrument specific variables. It provides the instrument with access to variables associated with global controls and other site-wide information. The control computer 1125 also preferably provides a link to the site-wide Ethernet allowing (under the direction of the instrument scientist) remote monitoring or control of the experiment.

It is to be understood that while the invention has been described in conjunction with the preferred specific embodiments thereof, that the foregoing description as well as the examples which follow are intended to illustrate and not limit the scope of the invention. Other aspects, advantages and modifications within the scope of the invention will be apparent to those skilled in the art to which the invention pertains.

We claim:

1. A preamplifier circuit for processing a signal provided by a radiation detector, comprising:
   a transimpedance amplifier coupled to receive a current signal from a detector and generate a voltage signal at its output, said transimpedance amplifier generating said voltage signal proportional to said current signal without integrating said current signal; and
   a second amplification stage having an input coupled to an output of said transimpedance amplifier for providing an amplified voltage signal,
   wherein said second amplification stage comprises an op amp having an inverting input, and non-inverting input, and a single output for providing said amplified voltage signal, and wherein said inverting input of said op amp is coupled to the output of said transimpedance amplifier.

2. The preamplifier circuit of claim 1, further comprising a structure for compensating voltage or current offsets, wherein said structure for compensating is coupled to a non-inverting input of said op amp.

3. The preamplifier circuit of claim 2, wherein said structure for compensating comprises an external voltage source driving a voltage divider having one end grounded, wherein a center tap of said voltage divider is directly coupled to said non-inverting input of said op amp.

4. The preamplifier circuit of claim of 1, further comprising a differential output stage coupled to said second amplification stage, said differential output stage receiving said amplified voltage signal and providing first and second outputs.

5. The preamplifier circuit of claim 1, wherein said transimpedance amplifier has a feedback loop with a resistance under 100 kohms.

6. The preamplifier circuit of claim 1, wherein said second amplification stage further comprises a capacitor, and wherein the capacitor is in parallel with the op amp and adapted to stabilize the op amp.

7. The preamplifier circuit of claim 1, wherein the op amp in the second amplification stage does not provide a substantial amount of pulse shaping.

* * * * *